United States Patent [19]

Muramatsu

[11] Patent Number: 4,866,217

[45] Date of Patent: Sep. 12, 1989

[54] BUS BAR CIRCUIT BOARD STRUCTURE

[75] Inventor: Yukio Muramatsu, Kosai, Japan

[73] Assignee: Yazaki Corporation, Tokyo, Japan

[21] Appl. No.: 304,294

[22] Filed: Jan. 31, 1989

[30] Foreign Application Priority Data

Feb. 5, 1988 [JP] Japan ............................. 63-13609[U]

[51] Int. Cl.[4] ....................... H02G 3/16; B60R 16/02; H01R 9/00

[52] U.S. Cl. .................................... 174/72 B; 439/76; 439/714

[58] Field of Search .............. 174/72 B; 361/404, 406, 361/407; 439/34, 76, 709, 714, 718

[56] References Cited

U.S. PATENT DOCUMENTS 3,536,868 10/1970 Lawrence et al. ............ 174/72 B X

FOREIGN PATENT DOCUMENTS 58-63828 4/1983 Japan .................................. 174/72 B Primary Examiner—Laramie E. Askin
Attorney, Agent, or Firm—Armstrong, Nikaido, Marmelstein, Kubovcik & Murray

[57] ABSTRACT

A new bus bar circuit board structure is provided. The structure comprises insulation substrates and a plurality of bus bars arranged on the insulation substrates parallelly with each other. The respective substrates have an edge portion and each bus bar has a portion bend erected from the respective substrate along the edge portion thereof to form frame-shaped gate portions, each frame-shaped gate portion being within another frame-shaped gate portion and separated therefrom by way of a gap when developed in plan view.

4 Claims, 4 Drawing Sheets

BUS BAR CIRCUIT BOARD STRUCTURE

BACKGROUND OF THE INVENTION

This invention relates to an improvement in a bus bar circuit board which constitutes an internal circuit in a junction box in which a number of branch connections in an electric circuit for an automobile are made in a clustered manner.

Heretofore, prior art disclosed as a bus bar circuit board of this type in Japanese Utility Model Laid-Open No. 63828/1983 wherein a bus bar 3 which used to have a bulging portion intended to avoid interference with a terminal 2 rising below an insulation substrate 1 or a developed state 2' of a terminal 2 as shown in FIGS. 8A and 8B was proposed to be bend erected like a gate-like rising bus bar 3a such that the substrate space is minimized as shown in FIG. 9.

However, there is a situation in which two rising bus bars 3a and 3b must be arranged to run in parallel as shown in FIG. 10 in bus bar circuit design. In such a case, a partition wall 5 is protruded from the main cover 4 of the junction box A between the bus bars 3a and 3b to provide insulation. Thus, there are problems that a distance 1 from the inside bus bar 3a to the outside bus bar 3b must be assured to allow insertion of partition wall 5, the reduction in the size of insulating substrate 1 does not become effective, and the laying density of the bus bars is limited.

SUMMARY OF THE INVENTION

In order to solve the above mentioned problem, the invention provides a bus bar circuit board structure comprising insulation substrate means; and a plurality of bus bars arranged on said insulation substrate means parallelly with each other, said substrate means having an edge portion, said bus bars having a portion bend erected from said substrate means along said edge portion thereof to form frame-shaped gate portions, each frame-shaped gate portion being within another frame-shaped gate portion and separated therefrom by way of a gap when developed in plan view.

DESCRIPTION OF THE PREFERRED EMBODIMENTS

An embodiment of the present invention will be described in detail with reference to the accompanying drawings.

Figure 1:
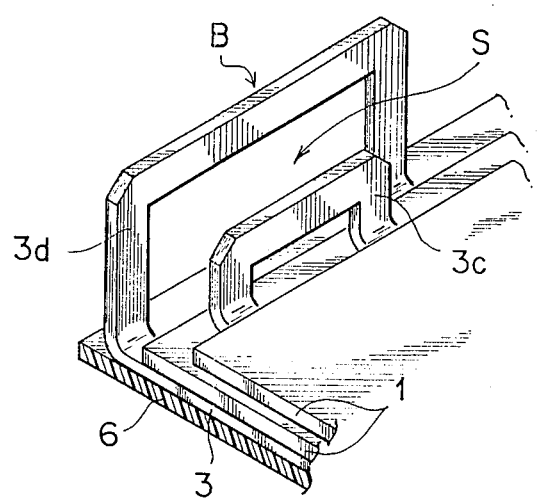
FIG. 1 is a perspective view of an essential portion of an embodiment of a bus bar circuit board structure according to the present invention.
Figure 2:
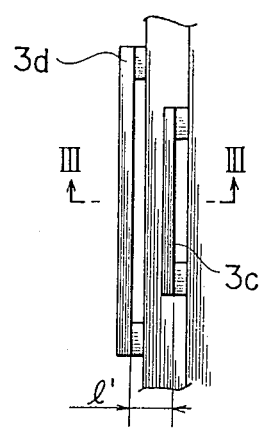
FIG. 2 is a plan view of FIG. 1.
Figure 3:
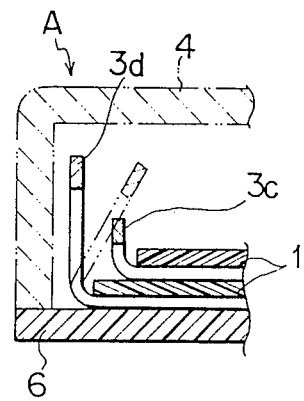
FIG. 3 is a sectional view taken along the line III—III of FIG. 2.

In FIGS. 1 through 3, a bus bar circuit board structure B illustrates an example in which two layers of insulation substrates 1 and bus bars 3 are superposed to alternate in sandwich fashion. The reference 6 denotes an undercover of a junction box A or another bus bar circuit board.

Bus bar portions 3c and 3d of the upper and lower bus bars 3 are bent at the edge portions of the upper and lower substrates 1 such that the lower bus bar is erected upward from below the lower substrate while the upper bus bars are erected from between the lower and upper substates, thus forming frame-shaped gate portions.

Further, the edge portions of the lower and upper substrates 1 are staggered from each other such that the bus bar portion 3c takes a position inward of the bus bar portion 3d by a distance l'.

Figure 4:
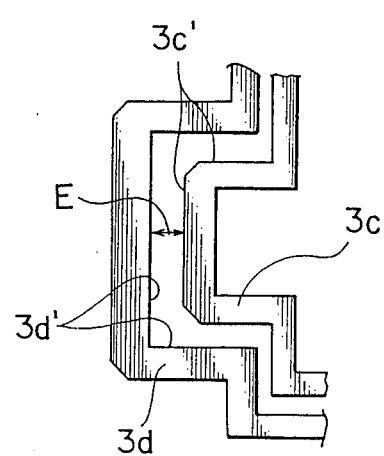
FIG. 4 is a developed view of erected bus bars in FIG. 1.

Said bus bar portion 3c is smaller than the bus bar portion 3d to be within the space S defined by the frame of the bus bar portions 3d. More specifically, a suitable insulating gap E exists between the outer edge 3c' of the bus bar portion 3c and the inner edge 3d' of the bus bar portion 3d when the bus bar portions 3c and 3d are developed in plan view as shown in FIG. 4.

Figure 5:
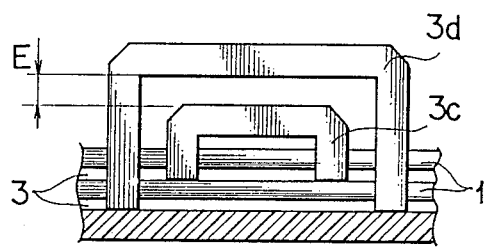
FIG. 5 is a front view of an essential portion of another embodiment of a bus bar circuit board structure according to the invention.
Figure 6:
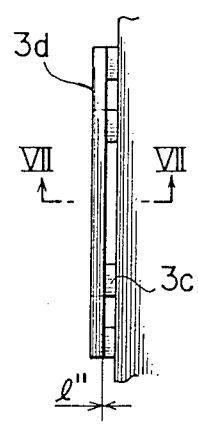
FIG. 6 is a plan view of FIG. 5.
Figure 7:
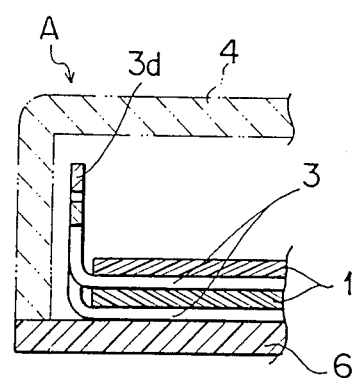
FIG. 7 is a sectional view taken along the line VII—VII of FIG. 6.
Figure 8A:
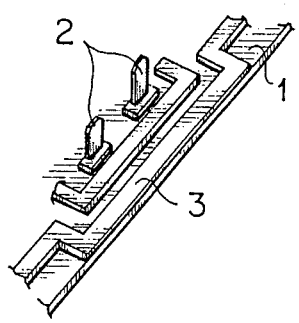
FIGS. 8A, 8B, 9, 10 and 11 are explanatory views of prior art examples.
Figure 8B:
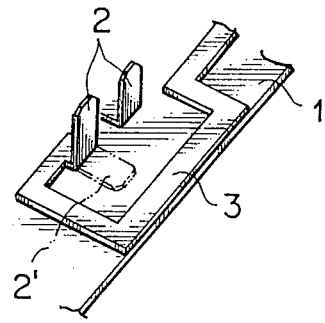
Figure 9:
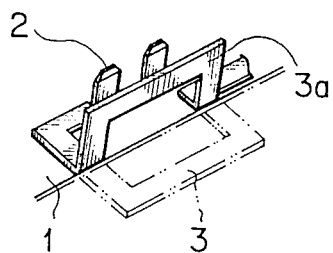
Figure 10:
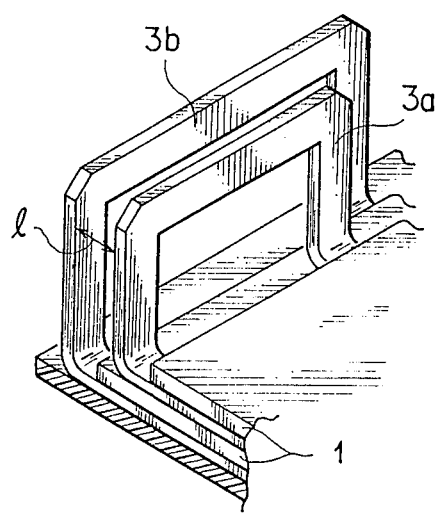

FIGS. 5 through 7 show another embodiment of the invention, in which two erected portions of the bus bar portions 3c and 3d are substantially superposed; that is, the edge portions of said first and second substrates are aligned with each other. In this case, a distance l" between the bus bars 3c and 3d becomes so near to zero that more space economy is accomplished than with the FIG. 2 embodiment.

Figure 11:
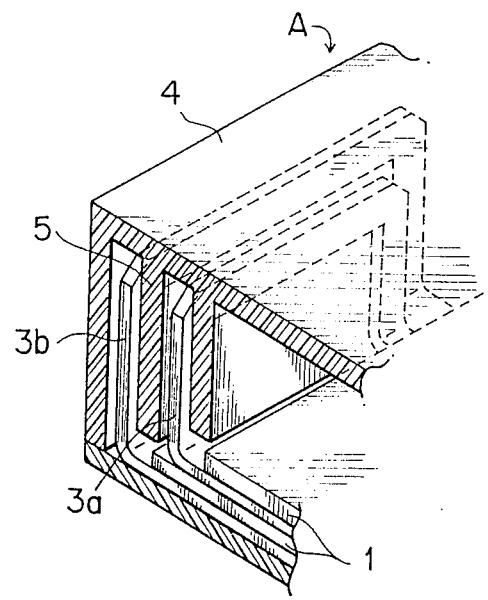

According to the present invention, the bus bars will not contact with each other even in the event of the bus bar portion 3d being tilted down to the other bus bar 3c as shown in FIG. 3, thus eliminating the need for an insulation partition wall 5 as seen in the prior art of FIG. 11.

Therefore, the size of the bus bar circuit board can be reduced, the laying density of the bus bars can be improved, and the internal structure of the main cover 4 can be simplified.

Since the distance between the gate-shaped bus bars of the bus bar circuit board of the invention can be reduced as described above, the size of the bus bar circuit board can be reduced, and the laying density of the bus bars can be enhanced.

What is claimed is:

1. A bus bar circuit board structure comprising insulation substrate means; and a plurality of bus bars arranged on said insulation substrate means parallelly with each other, said substrate means having an edge portion, said bus bars having a portion bend erected from said substrate means along said edge portion thereof to form frame-shaped gate portions, each frame-shaped gate portion being within another frame-shaped gate portion and separated therefrom by way of a gap when developed in plan view.

2. A bus bar circuit board structure according to claim 1, wherein said substrate means includes a plurality of substrates piled on top of the others, said plurality of bus bars and said plurality of substrates alternating in sandwich fashion.

3. A bus bar circuit board structure according to claim 2, wherein said plurality of substrates includes a first substrate and a second substrate while said plurality of bus bars includes a first bus bar and a second bus bar, the edge portions of said first and second substrates being staggered from each other such that said first bus bar is bend erected from below the first substrate, and said second bus bar is bend erected from between the first and second substrates.

4. A bus bar circuit board structure according to claim 2, wherein said plurality of substrates includes a first substrate and a second substrate while said plurality of bus bars includes a first bus bar and a second bus bar, the edge portions of said first and second substrates being aligned with each other such that said first bus bar is bend erected from below the first substrate, and said second bus bar is bend erected from between the first and second substrates.

* * * * *